(12) United States Patent
Watanabe (10) Patent No.: US 6,383,859 B2
(45) Date of Patent: May 7, 2002

(54) METHOD OF FORMING SEMICONDUCTOR DEVICE INCLUDING PATTERNING LOWER ELECTRODE OF CAPACITOR AND GATE ELECTRODE OF TRANSISTOR WITH SAME RESIST

(75) Inventor: Akiyoshi Watanabe, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/472,015

(22) Filed: Dec. 27, 1999

(30) Foreign Application Priority Data

Dec. 28, 1998 (JP) ............................ 10-374094

(51) Int. Cl.⁷ ......................................... H01L 21/8242
(52) U.S. Cl. .................... 438/239; 438/250; 438/393; 438/766; 438/952; 438/966
(58) Field of Search .................. 438/239, 250, 438/393, 766, 966, 253, 396, 957, 142, 197, 210, 238, 251, 252, 381, 394, 395, 755, 952; 257/296

(56) References Cited

U.S. PATENT DOCUMENTS 4,743,563 A * 5/1988 Pfiester et al. ............... 437/24
5,391,906 A * 2/1995 Natsume ...................... 257/379
5,397,729 A * 3/1995 Kayanuma et al. .......... 438/384
5,500,387 A * 3/1996 Tung et al. .................... 437/60
6,323,079 B1 * 11/2001 Takeshita ..................... 438/238

* cited by examiner

Primary Examiner—Caridad Everhart
Assistant Examiner—Craig P. Lytle
(74) Attorney, Agent, or Firm—Armstrong, Westerman & Hattori, LLP

(57) ABSTRACT

A silicon film is formed on a semiconductor substrate, and a silicon oxide film and a polycrystalline silicon film are formed thereon. Patterning is performed for the polycrystalline silicon film to form a capacitive upper electrode. Then, patterning is performed for the silicon oxide film to form a capacitive dielectric film below the capacitive upper electrode, the capacitive dielectric film having a shape larger than that of the capacitive upper electrode. Subsequently, an anti-reflection coating film (silicon nitride film which is silicon-rich) is formed on a full surface. Then, patterning is performed for the silicon film by means of photolithography to form a capacitive lower electrode and a gate electrode of a transistor.

9 Claims, 13 Drawing Sheets

METHOD OF FORMING SEMICONDUCTOR DEVICE INCLUDING PATTERNING LOWER ELECTRODE OF CAPACITOR AND GATE ELECTRODE OF TRANSISTOR WITH SAME RESIST

BACKGROUND OF THE INVENTION

1. Field of the Invention

The present invention relates to a method for manufacturing a semiconductor device, which includes a step of forming an anti-reflection coating film for the purpose of increasing fabrication accuracy in the step of photolithography, and a semiconductor device made by this manufacturing method. More specifically, the invention relates to a semiconductor device manufactured by integrating a capacitor and a transistor on a semiconductor substrate, and a manufacturing method of the same.

2. Description of the Prior Art

Figure 1A:
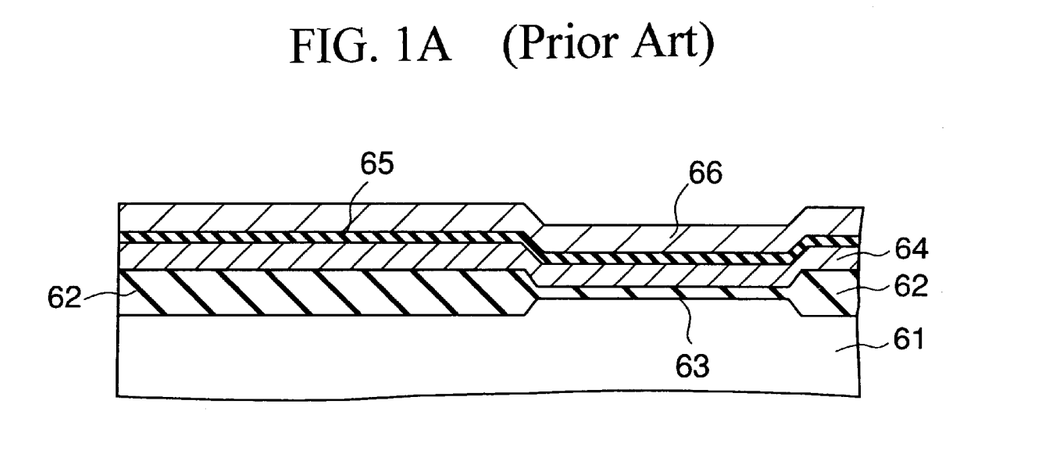
FIGS. 1A and 1B are first two sectional views showing a conventional method for manufacturing a semiconductor device.
Figure 1B:
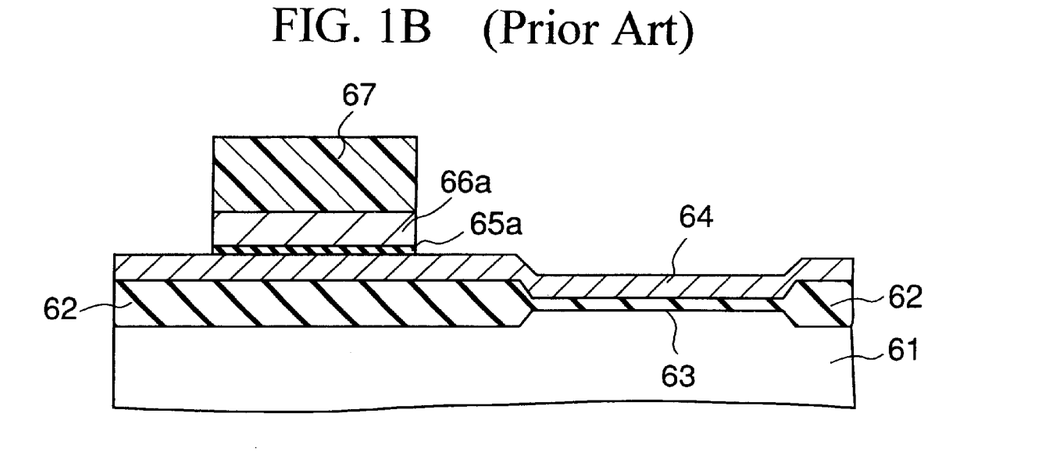
Figure 2A:
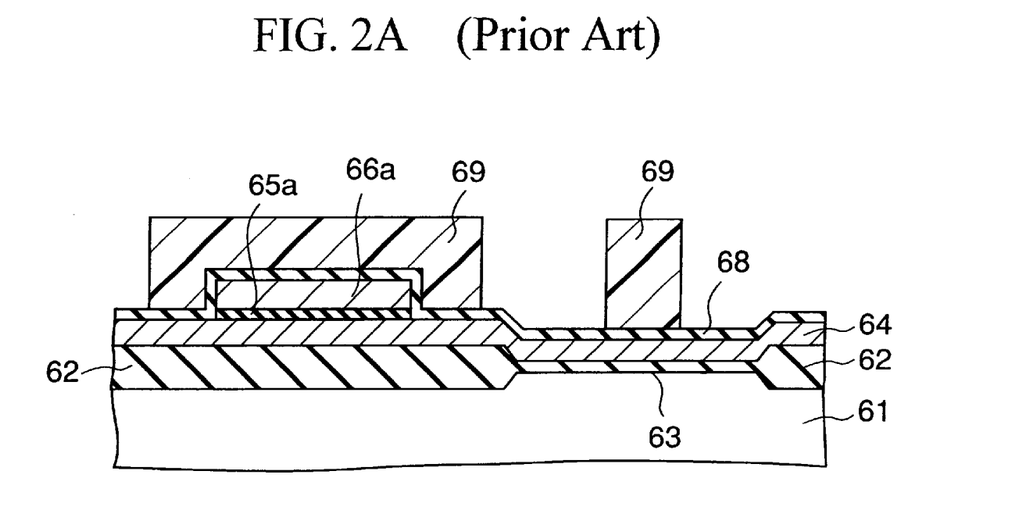
FIGS. 2A and 2B are second two sectional views showing the conventional method for manufacturing a semiconductor device.
Figure 2B:
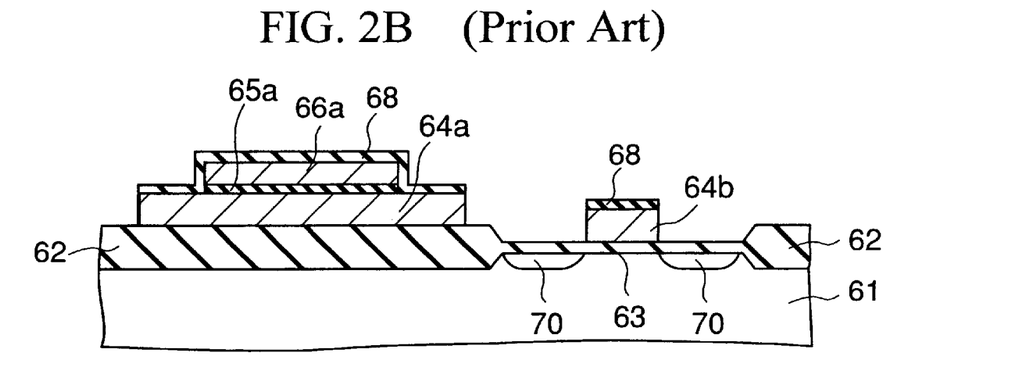
Figure 3A:
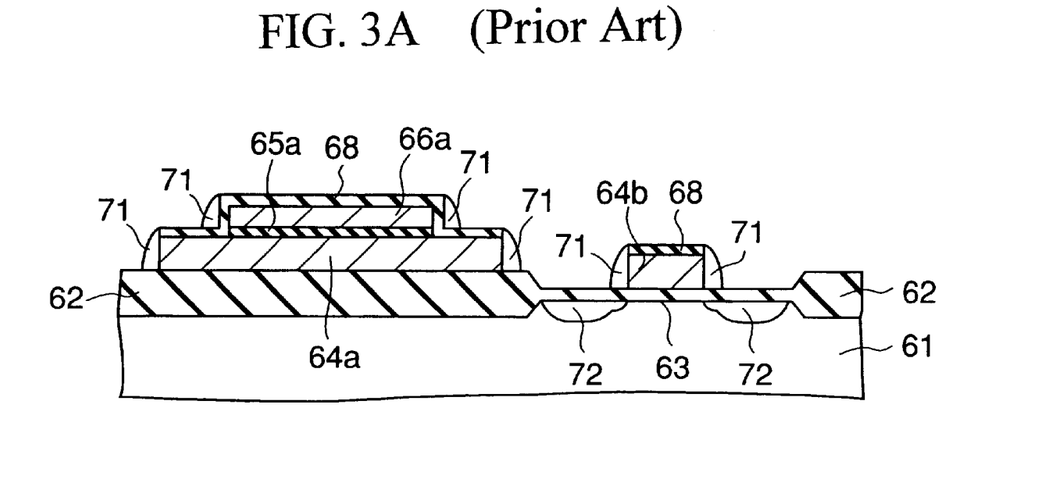
FIGS. 3A and 3B are third two sectional views showing the conventional method for manufacturing a semiconductor device.
Figure 3B:
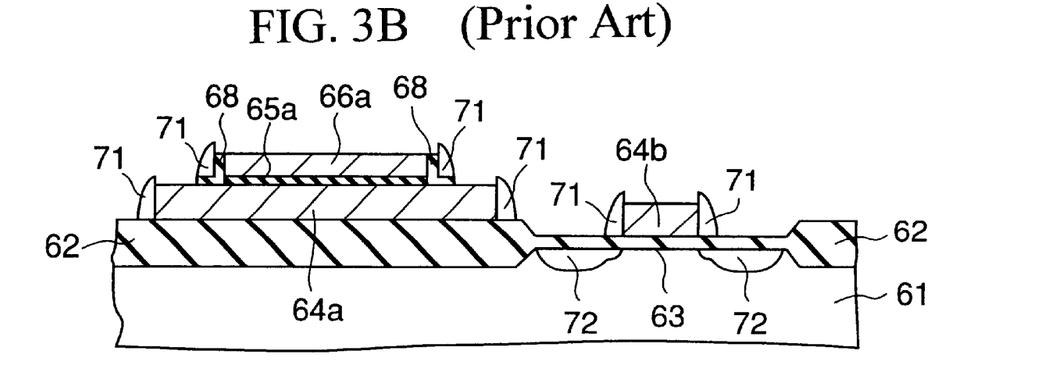

FIGS. 1 to 3 are sectional views showing a conventional method for manufacturing a semiconductor device having a capacitor and a MOS (Metal Oxide Semiconductor) transistor in the sequence of steps.

First, as shown in FIG. 1A, a field oxide film 62 is formed in a device isolation region of a semiconductor substrate 61 by means of LOCOS (Local Oxidation of Silicon). Also, a gate oxide film 63 is formed on the surface of a transistor forming region of the semiconductor substrate 61 with thermal oxidation.

Subsequently, a polycrystalline silicon film 64 is formed on a surface of the semiconductor substrate 61 so as to serve as a lower electrode of a capacitor (referred to as a capacitor lower electrode, hereinafter) and a gate electrode of a transistor. Then, by introducing high-concentration impurities (dopant) to the polycrystalline silicon film 64, electrical conductivity is provided.

Then, a silicon oxide film 65 is formed as a dielectric film of the capacitor (referred to as a capacitor dielectric film, hereinafter) on the polycrystalline silicon film 64, and a polycrystalline silicon film 66 is formed thereon so as to serve as an upper electrode of the capacitor (referred to as a capacitor upper electrode, hereinafter). Then, by introducing high-concentration impurities to the polycrystalline silicon film 66, electrical conductivity is provided.

Then, as shown in FIG. 1B, a resist pattern 67 is formed on the polycrystalline silicon film 66 so as to plot a shape of the capacitor upper electrode. Then, by using this resist pattern 67 as a mask, etching is performed for the polycrystalline silicon film 66 and the silicon oxide film 65 to form a capacitor dielectric film 65a and a capacitor upper electrode 66a. Subsequently, the resist pattern 67 is removed.

Then, as shown in FIG. 2A, an anti-reflection coating film 68 is formed on a surface of the semiconductor substrate 61. The polycrystalline silicon film 64 and the capacitor upper electrode 66a are covered with the anti-reflection coating film 68. The anti-reflection coating film 68 is then coated with photoresist. After the photoresist is subjected to exposure and development, a resist pattern 69 is formed so as to plot shapes of a capacitor lower electrode and a gate electrode of the MOS transistor.

Then, as shown in FIG. 2B, by using the resist pattern 69 as a mask, etching is performed for the anti-reflection coating film 68 and the polycrystalline silicon film 64 to form a capacitor lower electrode 64a and a gate electrode 64b. Subsequently, the resist pattern 69 is removed. Then, shallow and low-concentration impurities are ion-implanted to both sides of the gate electrode 64b of the semiconductor substrate 61 to form an LDD (Lightly Doped Drain) diffused layer 70 in self-alignment.

Then, a silicon oxide film is formed to be thick on a fill surface above the semiconductor substrate 61, and anisotropic etching is performed for this silicon oxide film. Accordingly, as shown in FIG. 3A, the silicon oxide film is left in the sides of the capacitor lower electrode 64a, the capacitor upper electrode 66a and the gate electrode 64b to form spacers 71. Subsequently, impurities are ion-implanted at relatively high concentration to both sides of the gate electrode 64b of the semiconductor substrate 61 to form impurity diffused regions 72 as a source and a drain of the MOS transistor in self-alignment.

Then, as shown in FIG. 3B, the anti-reflection coating film 68 on the capacitor upper electrode 66a, the capacitor lower electrode 64a and the gate electrode 64b is removed. Subsequently, an interlayer insulating film, a wiring (not shown), and so on, are formed to complete a semiconductor device having the capacitor and the MOS transistor of an LDD structure.

Along with the demand for much higher integration of a semiconductor device in recent years, a gate electrode or the like of a MOS transistor has tended to be shrunk. Thus, a KrF light source or an ArF light source has been used as a light source to be used in a photolithography. Also, for an anti-reflection coating film effective when any one of these light sources is used, a silicon nitride film (SiN) or a silicon oxynitride film (SiON) which is silicon-rich has been used.

SUMMARY OF THE INVENTION

It is an object of the present invention to provide a semiconductor device capable of preventing an insulation failure caused by an anti-reflection coating film, and preventing damage to a MOS transistor or a capacitor in etching step during spacer formation by leaving the anti-reflection coating film until spacers are formed. It is another object of the invention to provide a method for manufacturing the above semiconductor device.

Figure 7:
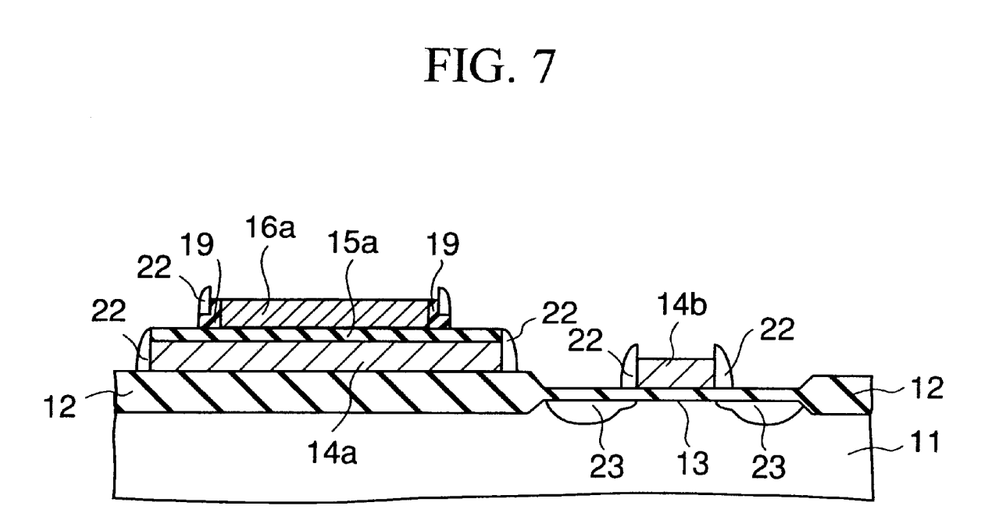
FIG. 7 is a fourth sectional view showing the method for manufacturing a semiconductor device according to the first embodiment of the invention.

In order to achieve the object, as specified in claim 1 and shown in FIG. 7, a semiconductor device of the invention comprises: a capacitor element; and an electrical field effect transistor. In this case, the capacitor includes a capacitor lower electrode (14a) formed on a semiconductor substrate (11) by interpolating an insulating film (12), a capacitor dielectric film (15a) formed on the capacitor lower electrode (14a), a capacitor upper electrode (16a) formed on the capacitor dielectric film (15a) so as to have a shape smaller than that of the same, and an anti-reflection coating film (19) formed on the capacitor dielectric film (15a) exposed to the outside of the upper electrode (16a).

In order to achieve the object, as specified in claim 3 and shown in FIGS. 4 to 7, a manufacturing method of the semiconductor device having the capacitor and the transistor comprises the steps of: forming first insulating films (12 and 13) on a semiconductor substrate (11); forming a first conductive film (14) on the first insulating films (12 and 13); forming a second insulating film (15) on the first conductive film (14); forming a second conductive film (16) on the second insulating film (15); forming an upper electrode (16a) of the capacitor by performing pattering for the second conductive film (16); forming a dielectric film (15a) of the capacitor below the upper electrode (16a) so as to have a shape larger than that of the same by performing patterning for the second insulating film (15); forming an anti-reflection coating film (19) on a full surface above the semiconductor substrate (11); forming a resist pattern (20) by coating the anti-reflection coating film (19) with photoresist and then subjecting the photoresist to exposure and development, the resist pattern being used to plot shapes of a lower electrode of the capacitor and a gate electrode of the transistor; forming a lower electrode (14a) of the capacitor and a gate electrode (14b) of the transistor by using the resist pattern (20) as a mask to perform patterning for the anti-reflection coating film (19) and the first conductive film (14); removing the anti-reflection coating film (19) remaining on the upper electrode (16a) of the capacitor and the gate electrode (14b) of the transistor after the resist pattern (20) is removed; and forming a source and a drain (23) of the transistor by introducing impurities to both sides of the gate electrode (14b) of the semiconductor substrate (11).

Figure 11A:
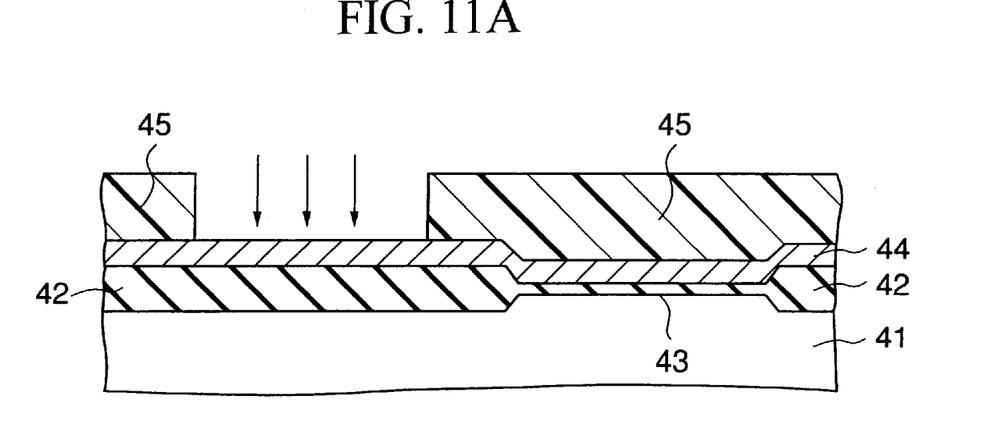
FIGS. 11A and 11B are first two sectional views showing a method for manufacturing a semiconductor device according to a third embodiment of the invention.
Figure 11B:
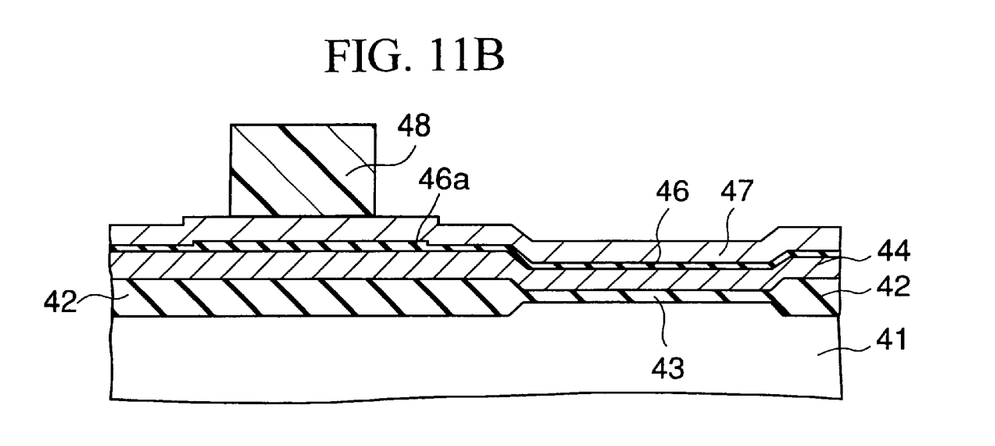
Figure 12A:
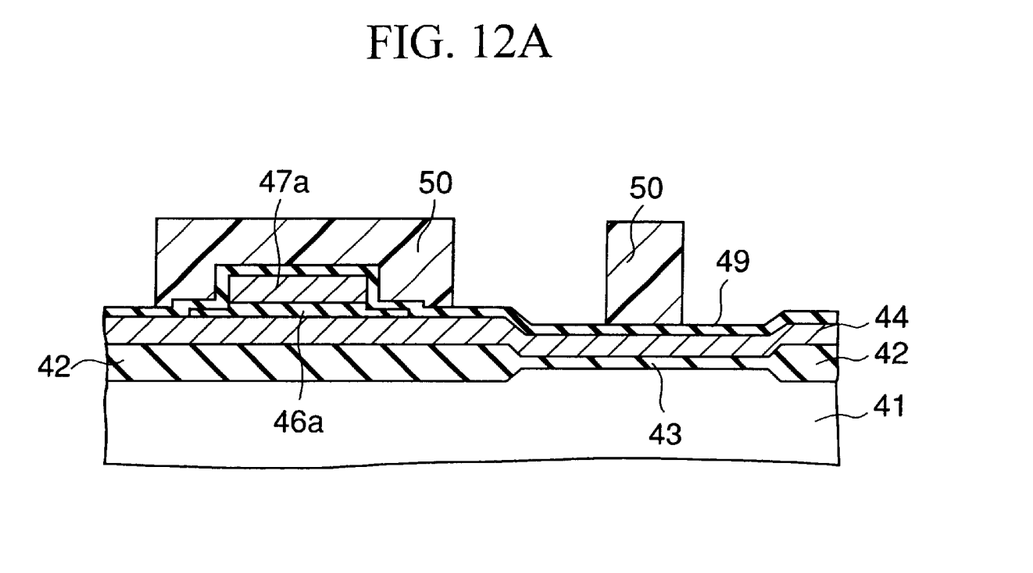
FIGS. 12A and 12B are second two sectional views showing the method for manufacturing a semiconductor device according to the third embodiment of the invention.
Figure 12B:
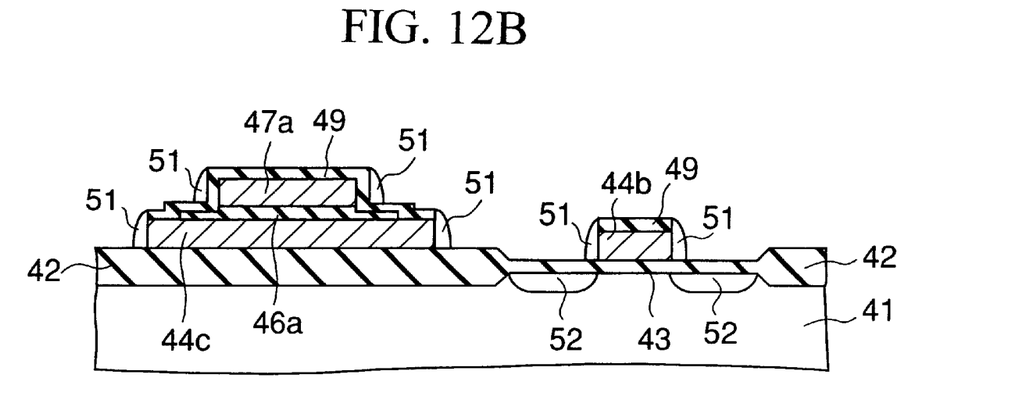
Figure 13:
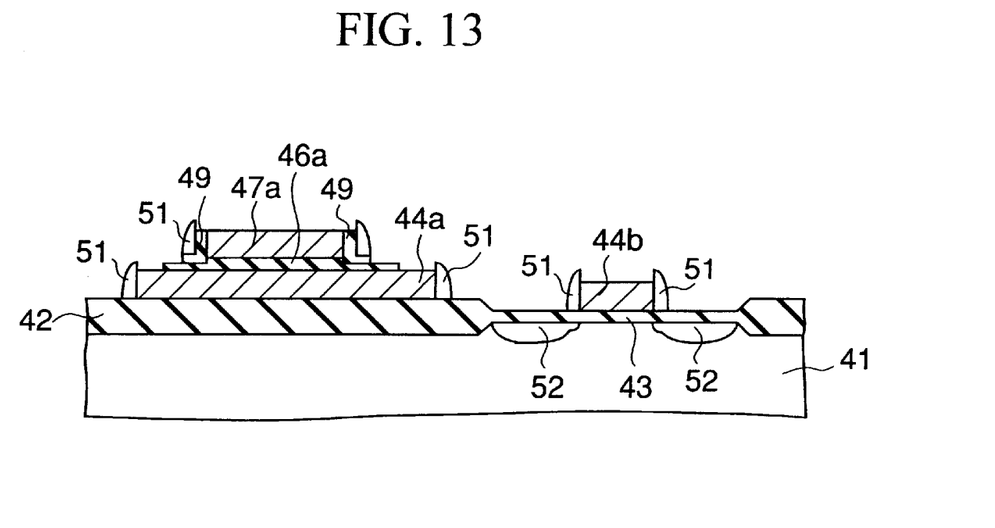
FIG. 13 is a third sectional view showing the method for manufacturing a semiconductor device according to the third embodiment of the invention.

In order to achieve the object, as specified in claim 8 and shown in FIGS. 11 to 13, a manufacturing method of the semiconductor device having the capacitor and the transistor comprises the steps of: forming insulating films (42 and 43) on a semiconductor substrate (41); forming a silicon film (44) made of amorphous silicon or polycrystalline silicon on the insulating films (42 and 43); selectively introducing impurities to a dielectric film forming region of the capacitor of the silicon film (44); forming an oxide film (46a) on the impurity introduced portion to be thicker than other portions by performing thermal oxidation for a surface of the silicon film (44); forming a conductive film (47) on a full surface above the semiconductor substrate (41); forming an upper electrode of the capacitor by performing patterning for the conductive film (47); leaving the impurity introduced portion (46a) of the oxide films (46 and 46a) formed with thermal oxidation as a dielectric film of the capacitor while removing the oxide film of the other portion (46); forming an anti-reflection coating film (49) on a full surface above the semiconductor substrate (41); forming a resist pattern (50) by coating the anti-reflection coating film (49) with photoresist and then subjecting the photoresist to exposure and development, the resist pattern being used to plot shapes of a lower electrode of the capacitor and a gate electrode of the transistor; forming a lower electrode (44a) of the capacitor and a gate electrode (44b) of the transistor by using the resist pattern (50) as a mask to perform patterning for the silicon film (44) and the anti-reflection coating film (49); removing the anti-reflection coating film (49) remaining on the upper electrode (47a) and the gate electrode (44b); and forming a source and a drain of the transistor by introducing impurities to both sides of the gate electrode (44b) of the semiconductor substrate (41).

In the manufacturing method of the semiconductor device as specified in claim 3, the second conductive film is formed on the second insulating film as a dielectric film of the capacitor, and the upper electrode of the capacitor is formed by performing patterning for the second conductive film. Then, patterning is performed for the second insulating film to form the dielectric film below the upper electrode to have a shape larger than that of the same. Then, patterning is performed for the conductive film below the dielectric film to form the lower electrode of the capacitor.

Therefore, since the dielectric film is formed to have a shape larger than that of the upper electrode, even if the anti-reflection coating film having low insulation remains above the lower electrode, insulation can be secured between the upper and lower electrodes by the dielectric film.

In the case of a MOS transistor having an LDD structure, insulating spacers are formed in the sides of the gate electrode. In this case, spacers are also formed inevitably in the sides of the upper and lower electrodes of the capacitor. A size of the dielectric film should preferably be decided based on a width of each spacer and alignment accuracy during exposure.

The first conductive film as the gate of the lower electrode of the capacitor and the transistor and the second conductive film as the upper electrode of the capacitor are formed by forming a silicon film made of undoped amorphous silicon or polycrystalline silicon, and then introducing impurities to the silicon film to provide electrical conductivity. Also, the first and second conductive films may be formed by impurity doped silicon by CVD method.

For the second insulating film as the dielectric film of the capacitor, for example, a high dielectric film such as a silicon oxide film, a silicon nitride film, a laminated layer of a silicon oxide film and a silicon nitride film, a tantalum oxide film or the like can be used.

In the case of using a KrF light source or an ArF light source as a light source for exposure of the photoresist, as an anti-reflection coating film, a silicon film, a silicon nitride film which is silicon-rich, a silicon oxynitride film which is silicon-rich or the like can be used. Such a film must have a refractive index of 2.3 or higher in order to function as the anti-reflection coating film. A usual silicon nitride film (good insulating film) has a refractive index of about 2.0 (±0.1). on the other hand, if a silicon nitride film or a silicon oxynitride film having a refractive index of 2.3 or higher is used, the film functions as a satisfactory anti-reflection coating film for the KrF or ArF light source. It is also possible to use a film made of only silicon as an anti-reflection coating film. Such a film made of only silicon has a refractive index of 3.8.

In the case of using a silicon film, a silicon nitride film which is silicon-rich or a silicon oxide and nitride film which is silicon-rich as an anti-reflection coating film, the anti-reflection coating film can be removed by means of wet etching using phosphoric acid or phosphoric acid mixed liquid.

In the manufacturing method of the semiconductor device as specified in claim 8, the silicon film made of amorphous silicon or polycrystalline silicon is formed on the insulating film and, after impurities are selectively introduced to the silicon film, thermal oxidation is performed for the surface of the silicon film. An oxidation rate of the impurity-introduced portion is higher than that of the other portion. As a result, an oxide film is formed on the impurity-introduced portion so as to be thicker than that in the other portion.

Subsequently, the upper electrode of the capacitor is formed on the oxide film formed to be thick, and the oxide film in the portion, to which no impurities have been introduced, is removed. Accordingly, the oxide film remaining below the upper electrode becomes a dielectric film of the capacitor. Then, patterning is performed for the silicon film to form the lower electrode of the capacitor.

Also in this case, since the dielectric film having a shape larger than that of the upper electrode exists below the upper electrode, even if the anti-reflection coating film remains in the side of the upper electrode, insulation can be secured between the upper and lower electrodes.

DESCRIPTION OF THE PREFERRED EMBODIMENTS

Insulation provided by the silicon nitride film or the silicon oxynitride film which is silicon-rich has not proved to be satisfactory. When only transistors are formed on a semiconductor substrate, no problems occur because all portions of an anti-reflection coating film are removed after formation of spacers. But when a capacitor is formed as described above, the anti-reflection coating film 68 inevitably remains in the side of the capacitor upper electrode 66a as shown in FIG. 3B. As a result, if this anti-reflection coating film 68 is composed of a silicon oxide film or a silicon nitride film which is silicon-rich, current leakage or a failure breakdown voltage may occur between the upper and lower electrodes 66a and 64a of the capacitor because of the anti-reflection coating film 68.

The anti-reflection coating film 68 may be removed before formation of the spacers 71. The removal of the silicon nitride film or the silicon oxynitride film is generally carried out by means of wet etching containing heated phosphoric acid. However, the removal of the anti-reflection coating film 68 composed of the silicon nitride film or the silicon oxynitride film before the formation of the spacers 71 is not recommended. This is because during etching, damage may be given to the polycrystalline capacitor upper electrode 66a, the capacitor lower electrode 64a, the gate electrode 64b or the like, a MOS interface of the semiconductor substrate 61 may be contaminated and, consequently, a transistor characteristic or a capacitor characteristic may be reduced. On the other hand, the anti-reflection coating film 68 should preferably be left until spacers are formed.

This is because during anisotropic etching for spacer formation, damage to the transistor or the capacitor can be effectively reduced. It can thus be understood that the anti-reflection coating film should be removed after spacer formation.

Next, description will be made of the preferred embodiments of the present invention with reference to the attached drawings.

(First Embodiment)

FIGS. 4 to 7 are sectional views showing a method for manufacturing a semiconductor device in the sequence of steps according to a first embodiment of the present invention.

Figure 4A:
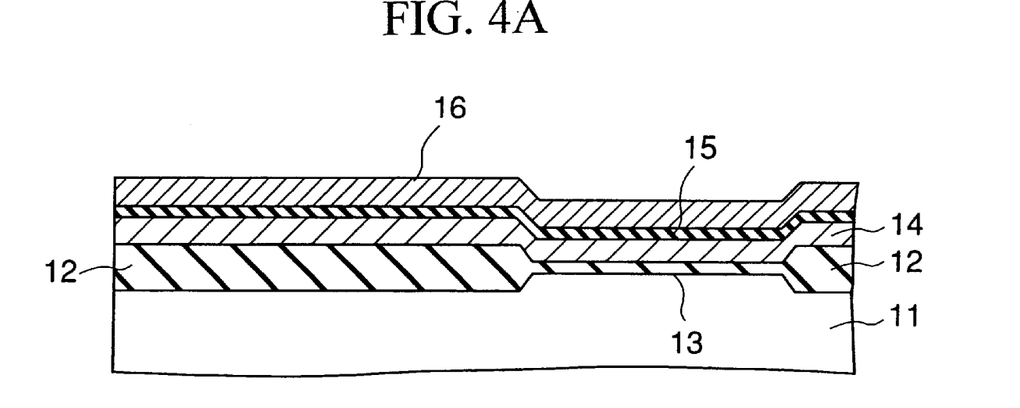
FIGS. 4A and 4B are first two sectional views showing a method for manufacturing a semiconductor device according to a first embodiment of the invention.

First, as shown in FIG. 4A, a field oxide film 12 having a thickness of about 300 nm is formed in an element isolation region of a semiconductor substrate 1 by means of LOCOS. A gate oxide film 13 having a thickness of about 50 nm is formed on a transistor forming region of the semiconductor substrate 11 with thermal oxidation. Then, undoped polycrystalline silicon is deposited on a full surface above the semiconductor substrate 11 by a CVD (Chemical Vapor Deposition) method, and a polycrystalline silicon film 14 having a thickness of about 150 nm is formed. Then, phosphorus as n-type impurities is introduced to the polycrystalline silicon film 14 by, for example vapor phase diffusion. Accordingly, electrical conductivity is provided to the polycrystalline silicon film 14.

Subsequently, on the polycrystalline silicon film 14, a silicon oxide film 15 having a thickness of about 30 nm is formed to serve as a dielectric film for a capacitor. This silicon oxide film 15 can be formed by a CVD method under a temperature condition of, for example about 750 to 800° C. The dielectric film for the capacitor may use a silicon nitride film instead of the silicon oxide film 15. Alternatively, the dielectric film may have a laminated structure of a silicon oxide film and a silicon nitride film. Also, as the dielectric film for the capacitor, a high dielectric film such as a tantalum oxide film or the like can be used.

Then, undoped polycrystalline silicon is deposited on the silicon oxide film 15 by a CVD method to form a polycrystalline silicon film 16 having a thickness of about 150 nm. Then, electrical conductivity is provided by introducing phosphorus to this polycrystalline silicon film 16. In the embodiment, the silicon films 14 and 16 are formed by depositing polycrystalline silicon as described above. But the silicon films 14 and 16 may be formed by depositing amorphous silicon. Also, a conductive silicon film may be formed by using a CVD method to grow a polycrystalline silicon or amorphous silicon film above the substrate 11, impurities having been introduced to the silicon film. Further, a laminated structure may be employed, which is made of one selected from the polycrystalline silicon and amorphous silicon films and another conductive film (metal film or the like).

Figure 4B:
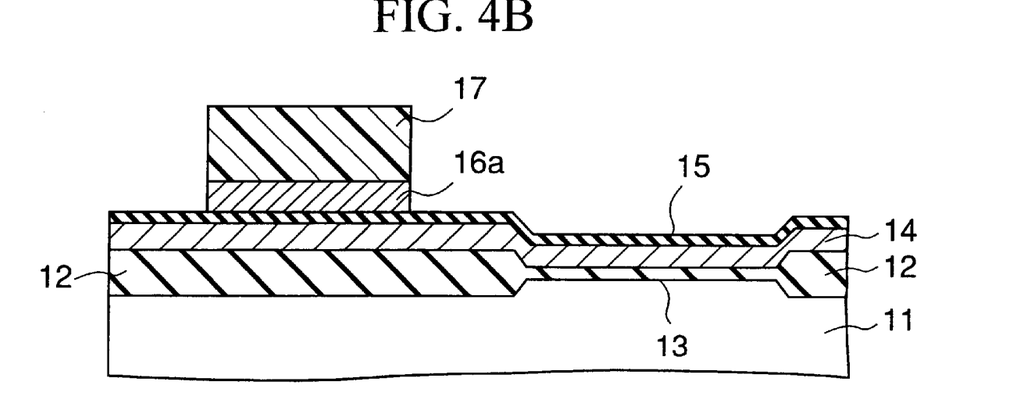

Subsequently, as shown in FIG. 4B, a resist pattern 17 is formed on the silicon film 16 to plot a shape of a capacitor upper electrode. Then, by using this resist pattern 17 as a mask, dry etching is performed for the silicon film 16 to form a capacitor upper electrode 16a. To perform dry etching for the silicon film 16, for example chlorine-containing gas ($Cl_2/O_2$) or HBr gas is used. Subsequently, the resist pattern 17 is removed.

Figure 5A:
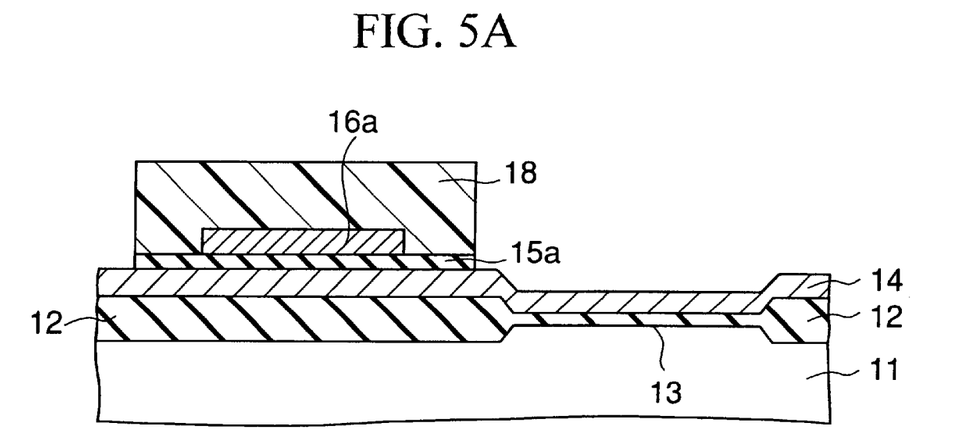
FIGS. 5A and 5B are second two sectional views showing the method for manufacturing a semiconductor device according to the first embodiment of the invention.

Then, as shown in FIG. 5A, a resist pattern 18 is formed to cover the capacitor upper electrode 16a. In this case, a space between an edge of the capacitor upper electrode 16a and an edge of the resist pattern 18 (space in a horizontal direction) should be set equal to a value or higher, which is obtained by adding a width of a later-described spacer 22 and mask alignment accuracy in a photolithographic step. For example, a space between the edge of the capacitor upper electrode 16a and the edge of the resist pattern 18 is set to about 1 μm.

Subsequently, by using the resist pattern 18 as a mask, the silicon oxide film 15 is removed by means of, for example wet etching containing hydrofluoric acid. Accordingly, the silicon oxide film 15 remaining below the resist pattern 18 becomes a capacitor dielectric film 15a. Then, the resist pattern 18 is removed.

Figure 5B:
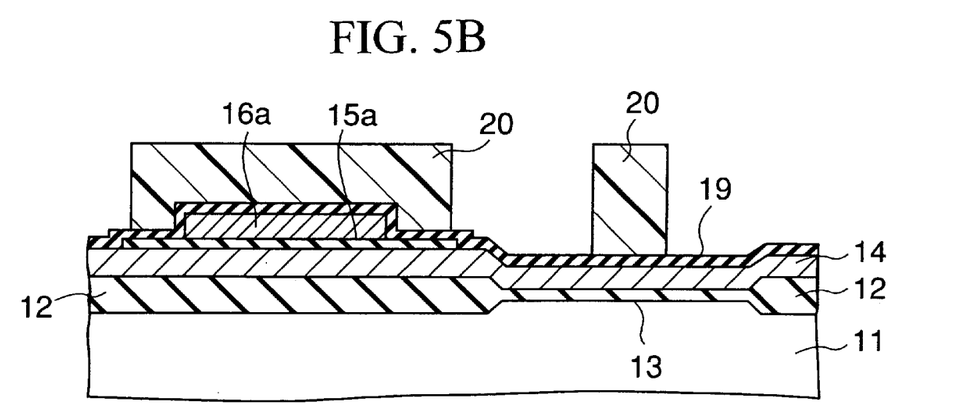

Subsequently, as shown in FIG. 5B, on a full surface above the semiconductor substrate 11, a silicon nitride film 19 which is silicon-rich is formed as an anti-reflection coating film to have a thickness of about 30 nm by a plasma CVD method. Then, the silicon nitride film 19 is coated with photoresist, and the photoresist is subjected to selective exposure by an aligner using a KrF light source or an ArF light source. After the selective exposure, development is performed to form a resist pattern 20 for plotting shapes of a capacitor lower electrode and a transistor gate electrode.

For the anti-reflection coating film, in stead of the silicon nitride film which is silicon-rich, a silicon film or a silicon oxynitride film which is silicon-rich can be used. For both of the silicon nitride film and the silicon oxide and nitride film, refractive index are larger as silicon contents are increased. The silicon nitride film which is silicon-rich is one having a refractive index of 2.3 to 3.8. The silicon oxynitride film which is silicon-rich is one having a refractive index of 2.3 to 3.8.

Figure 6A:
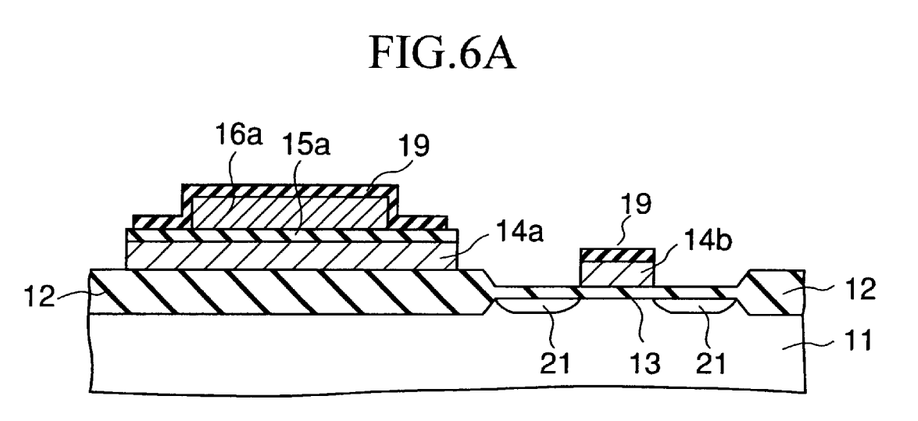
FIGS. 6A and 6B are third two sectional views showing the method for manufacturing a semiconductor device according to the first embodiment of the invention.

Then, anisotropic dry etching is performed by using the resist pattern 20 as a mask and, as shown in FIG. 6A, the silicon nitride film 19 and the polycrystalline silicon film 14 are subjected to patterning. At this time, by using the capacitor dielectric film 15a made of silicon oxide as a hard mask, a capacitor lower electrode 14a is formed in self-alignment. Subsequently, the resist pattern 20 is removed. Then, shallow and low-concentration impurities are introduced to both sides of a gate electrode 14b of the semiconductor substrate 11 to form an LDD diffused layer 21.

Figure 6B:
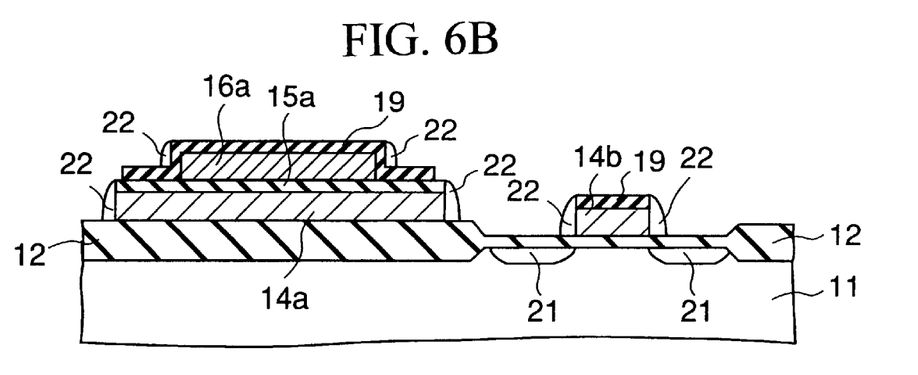

Then, as shown in FIG. 6B, a silicon oxide film having a thickness of about 150 nm is formed on a full surface above the semiconductor substrate 11. Anisotropic etching based on reactive ion etching is then performed to form silicon oxide spacers 22 respectively in the sides of the transistor gate electrode 14b, the capacitor upper electrode 16a and the capacitor lower electrode 14a.

Then, as shown in FIG. 7, wet etching containing heated phosphoric acid (or phosphoric acid mixed liquid) is performed to remove the silicon nitride film 19 exposed above the semiconductor substrate 11. Subsequently, impurities are introduced to both sides of the gate electrode 14b of the semiconductor substrate 11 to form impurity diffused regions 23 as a source and a drain for a MOS transistor in self-alignment.

Then, an interlayer insulating film, a wiring (not shown), and so on, are formed by a widely known method. Thus, a semiconductor device having the capacitor and the MOS transistor of the LDD structure is completed.

In the embodiment, the silicon nitride film 19 which is silicon-rich remains in the side of the capacitor upper electrode 16a to be in contact with the same, but the capacitor dielectric film 15a is provided between the silicon nitride film 19 and the capacitor lower electrode 14a. Accordingly, satisfactory insulation is secured between the upper capacitor electrode 16a and the capacitor lower electrode 14a, and the occurrence of a failure of breakdown voltage or current leakage can be prevented. Moreover, during formation of the spacers 22, since the polycrystalline silicon upper and lower electrodes 16a and 14a and the gate electrode 14b are covered with the silicon nitride film 19 (anti-reflection coating), the upper and lower electrodes 16a and 14a and the gate electrode 14b can be prevented from being damaged at the time of wet etching performed by using phosphoric acid.

(Second Embodiment)

Figure 8A:
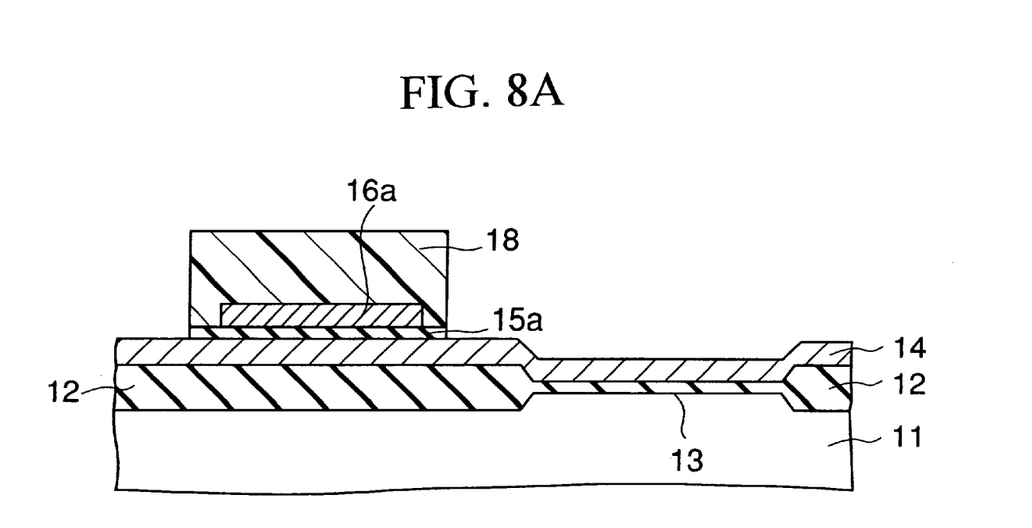
FIGS. 8A and 8B are first two sectional views showing a method for manufacturing a semiconductor device according to a second embodiment of the invention.
Figure 8B:
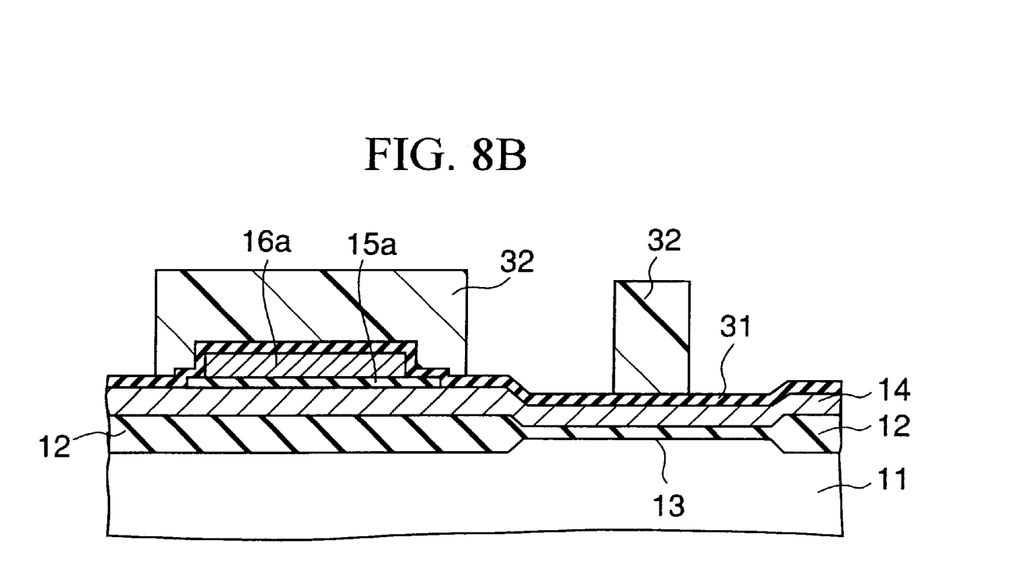
Figure 9A:
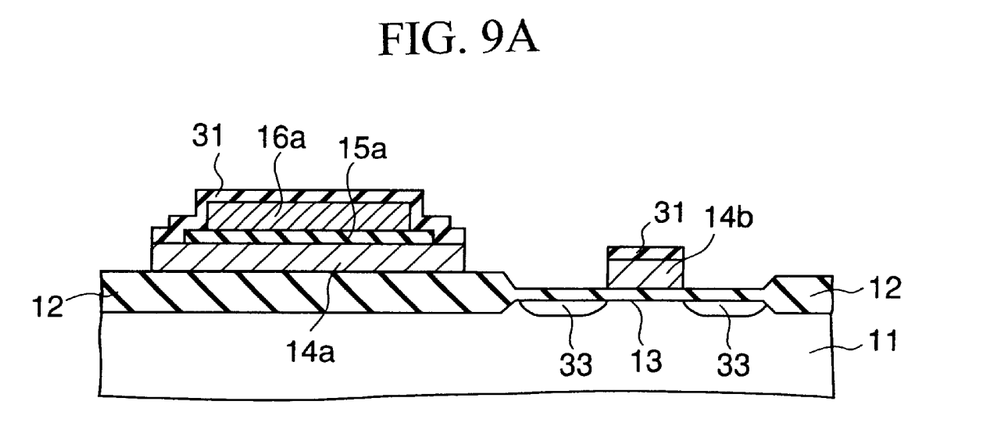
FIGS. 9A and 9B are second two sectional views showing the method for manufacturing a semiconductor device according to the second embodiment of the invention.
Figure 9B:
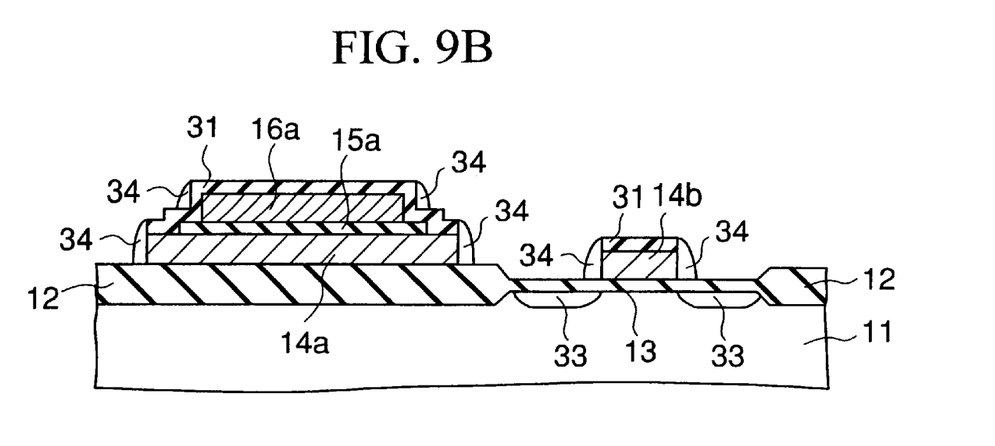
Figure 10:
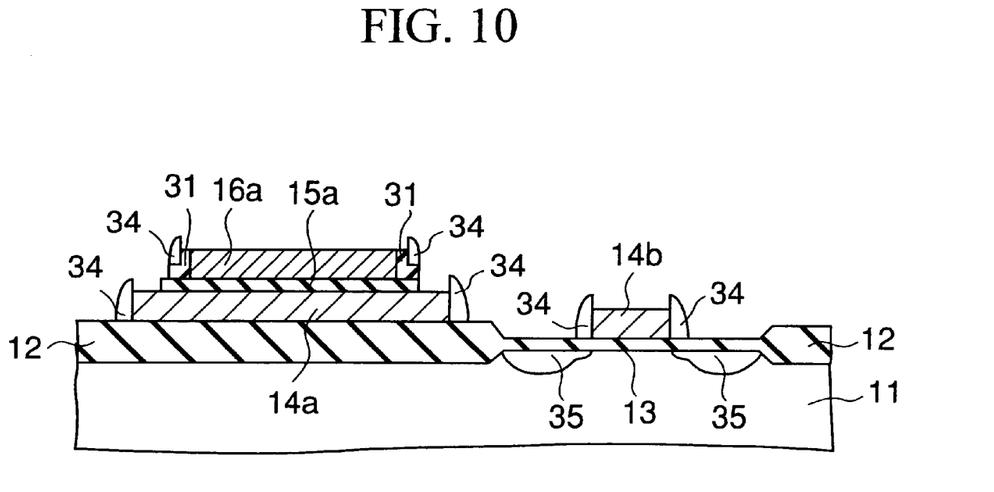
FIG. 10 is a third sectional view showing the method for manufacturing a semiconductor device according to the second embodiment of the invention.

FIGS. 8 to 10 are sectional views showing a method for manufacturing a semiconductor device in the sequence of steps according to a second embodiment of the present invention.

In steps similar to those described above with reference to the first embodiment shown in FIGS. 4A to 4B, as shown in FIG. 8A, a field oxide film 12, a gate oxide film 13, a polycrystalline silicon film 14, a silicon oxide film and a capacitor upper electrode 16a are respectively formed on a semiconductor substrate 11, and a resist pattern 18 is formed on the silicon oxide film. Then, by using the resist pattern as a mask, patterning is performed for the silicon oxide film to form a capacitor dielectric film 15a.

Subsequently, after removal of the resist pattern 18, as shown in FIG. 8B, a silicon nitride film 31 which is silicon-rich is formed as an anti-reflection coating film on a full surface above the semiconductor substrate 11. The silicon nitride film 31 is then coated with photoresist, and the photoresist is subjected to selective exposure by an aligner using a KrF or an ArF light source. After the selective exposure, development is performed to form a resist pattern 32 for plotting shapes of a capacitor lower electrode and a gate electrode. In this case, the resist pattern 32 is set such that an edge thereof can be positioned slightly outside more than an edge of the capacitor dielectric film 15a.

Then, as shown in FIG. 9A, by using the resist pattern 32 as a mask, etching is performed for the silicon nitride film 31 and the polycrystalline silicon film 14 to form a capacitor lower electrode 14a and a gate electrode 14b. The resist pattern 32 is then removed. Shallow and low-concentration impurities are introduced to both sides of the gate electrode 14b of the semiconductor substrate 11 to form an LDD diffused region 33.

In the first embodiment, the capacitor lower electrode 14a is formed by using the capacitor dielectric film 15a as a hard mask. In the second embodiment, however, as described above, the capacitor lower electrode 14a and the gate electrode 14b are formed by using the resist pattern 32 as a mask.

Then, as shown in FIG. 9B, a silicon oxide film having a thickness of about 150 nm is formed on a full surface of the semiconductor substrate 11 by a CVD method. Then, anisotropic etching based on reactive ion etching is performed for the silicon oxide film to form silicon oxide spacers 34 respectively in the sides of the gate electrode 14b, the capacitor upper electrode 16a and the capacitor lower electrode 14a.

Then, as shown in FIG. 10, by means of wet etching containing heated phosphoric acid, the silicon nitride film 31 exposed above the semiconductor substrate 11 is removed. Subsequently, impurities are introduced to both sides of the gate electrode 14b of the semiconductor substrate 11 to form impurity diffused regions 35 as a source and a drain for a transistor in self-alignment. Then, an interlayer insulating film, a wiring (not shown), and so on, are formed by a widely known method. Thus, a semiconductor device having the capacitor element and the MOS transistor is completed.

Also in the second embodiment, the silicon nitride film 31 (anti-reflection coating film) which is silicon-rich and in contact with the capacitor upper electrode 16a remains in the side of the capacitor upper electrode 16a. However, since the capacitor dielectric film 15a (silicon oxide film) is provided between the silicon nitride film 31 and the capacitor lower electrode 14a, as in the case of the first embodiment, insulation is secured between the capacitor upper electrode 16a and the capacitor lower electrode 14a, and the occurrence of a failure of breakdown voltage or current leakage can be prevented. In addition, during formation of the spacers 34, since the polycrystalline silicon upper and lower electrodes 16a and 14a and the gate electrode 14b are covered with the silicon nitride film 31 (anti-reflection coating film), the upper and lower electrodes 16a and 14a and the gate electrode 14b can be prevented at the time of wet etching performed by using phosphoric acid.

(Third Embodiment)

FIGS. 11 to 13 are sectional views showing a method for manufacturing a semiconductor device in the sequence of steps according to a third embodiment of the present invention.

First, as shown in FIG. 11A, a field oxide film 42 having a thickness of about 300 nm is formed on a semiconductor substrate 41 for element isolation. A surface of the semiconductor substrate 41 surrounded with the field oxide film 42 is then oxidized with thermal oxidation to form a gate oxide film 43 having a thickness of about 50 nm.

Subsequently, an undoped polycrystalline silicon film 44 having a thickness of about 150 nm is formed on a full surface above the semiconductor substrate 41. Then, a resist pattern 45 is formed on the polycrystalline silicon film 44 so as to be opened for a portion for forming a capacitor lower electrode. Then, through the opening of the resist pattern 45, for example phosphorus as n-type impurities is ion-implanted to the polycrystalline silicon film 44 at concentration of about $10^{15}$ to $10^{16}/cm^2$. The resist pattern 45 is then removed. In this case, an opening of the resist pattern 45 is also provided in a portion as a gate electrode for forming a transistor beforehand, and n-type impurities are introduced to the polycrystalline silicon film 44 of this portion. For forming a dual gate transistor where the types of impurities to be introduced to the gate electrode portion are changed between an NMOS transistor and a PMOS transistor, an opening of the resist pattern 45 is provided only in the gate electrode portion of the NMOS transistor. Then, n-type impurities are introduced to the polycrystalline silicon film 44 of this portion. In a region of the PMOS transistor for the gate electrode, p-type impurities are selectively introduced to the polycrystalline silicon film 44 of this portion by using another resist or the like as a mask.

Then, thermal oxidation is performed for a surface of the polycrystalline silicon film 44 in wet atmosphere having a temperature of 800° C. to form a silicon oxide film 46. In this case, as shown in FIG. 11B, in the region of the polycrystalline silicon film 44 to which phosphorus has been ion-implanted, the silicon oxide film is formed to be thicker than that in the other region because of a so-called oxidation enhanced phenomenon where an oxidation rate of the impurity introduced portion is high. For example, a silicon oxide film 46a having a thickness of about 50 nm is formed in the impurity-introduced portion, and in the other portion, a silicon oxide film 46 having a thickness of about 5 nm is formed. As it is difficult for an oxidation enhanced phenomenon to appear if a temperature for heat treatment is high, preferably, a temperature for heat treatment should be set equal to 900° C. or lower.

Subsequently, an undoped polycrystalline silicon film 47 is formed on the silicon oxide films 46 and 46a. A deposition condition at this time is the same as that for the formation of the polycrystalline silicon film 44. Then, for example, phosphorus as n-type impurities is ion-implanted to the entire polycrystalline silicon film 47 at concentration of about $10^{15}$ to $10^{16}/cm^2$ and, accordingly, electrical conductivity is provided.

Then, on the polycrystalline silicon film 47, a resist pattern 48 is formed to plot a shape of a capacitor upper electrode. This resist pattern 48 is formed above the silicon oxide film 46a to have a size slightly smaller than that of the same.

Then, as shown in FIG. 12A, by using the resist pattern 48 as a mask, etching is performed for the polycrystalline silicon film 47 to form a capacitor upper electrode 47a. Subsequently, by using diluted hydrofluoric acid, etching is performed for the silicon oxide film 46 under the condition of leaving the silicon oxide film 46a in a portion formed to be thick because of an oxidation enhanced phenomenon and removing the silicon oxide film 46 in the other portions. Then, the remaining silicon oxide film 46a becomes a capacitor dielectric film (referred to as a capacitor dielectric film 46a, hereinafter).

Then, on a full surface above the semiconductor substrate 41, a silicon nitride film 49 which is silicon-rich is formed by a plasma CVD method so as to have a thickness of about 30 nm and serve as an anti-reflection coating film. The silicon nitride film 49 is then coated with photoresist, and the photoresist is subjected to selective exposure by an aligner using a KrF light source or an ArF light source. After the selective exposure, development is performed to form a resist pattern 50 for plotting shapes of a capacitor lower electrode and a transistor gate electrode.

Subsequently, as shown in FIG. 12B, by using the resist pattern 50 as a mask, anisotropic dry etching is performed for the silicon nitride film 49 and the polycrystalline silicon film 44 to form a capacitor lower electrode 44a and a gate electrode 44b. Then, the resist pattern 50 is removed.

Then, shallow and low-concentration impurities are introduced to both sides of the gate electrode 44b to form an LDD diffused layer. On a full surface above the semiconductor substrate 41, a silicon oxide film having a thickness of about 150 nm is formed by a CVD method. Anisotropic etching based on reactive ion etching is then performed for the silicon oxide film to form spacers 51 respectively in the sides of the gate electrode 44b, the capacitor upper electrode 47a and the capacitor lower electrode 44a.

Then, as shown in FIG. 13, wet etching containing heated phosphoric acid is performed to remove the silicon nitride film 49 exposed above the semiconductor substrate 41. Subsequently, by using the gate electrode 44b and the spacers 51 in both sides thereof as masks, impurities are ion-implanted at high concentration to the semiconductor substrate 41 in both side portions of the gate electrode 44b to form impurity diffused regions 52 as a source and a drain for the transistor. Then, an interlayer insulating film, a wiring, and so on, are formed by a widely known method. Thus, a semiconductor device having the capacitor and the MOS transistor is completed.

Also in the third embodiment, the anti-reflection coating film (silicon nitride film 49) remains below the spacer 51. However, since the capacitor dielectric film 46a is extended to the outside of the spacer 51, insulation between the capacitor upper electrode 47a and the capacitor lower electrode 44a can be secured. Thus, the embodiment provides the same effects as those provided by the first and second elements.

In recent years, transistors have been developed to be driven by low voltages of, for example about 2.5 V to 1.3 V.

In the case of the transistor driven by such a low voltage, a typical way of improving characteristics of PMOS and NMOS transistors is to introduce p-type impurities to a gate electrode of the PMOS transistor and n-type impurities to a gate electrode of the NMOS transistor. A manufacturing process of such a transistor must include steps of first forming an undoped silicon film and then selectively introducing n-type or p-type impurities to the silicon film. In the embodiment, when n-type or p-type impurities are introduced to the portion as the gate electrode of the transistor, impurities are also introduced simultaneously to the portion for forming the capacitor dielectric film. Thus, an increase in the number of manufacturing steps can be prevented.

What is claimed is:

1. A method for manufacturing a semiconductor device, comprising, in the described order, the steps of:

forming a first insulating film on a semiconductor substrate;

forming a first conductive film on the first insulating film;

forming a second insulating film on the first conductive film;

forming a second conductive film on the second insulating film;

forming a capacitor upper electrode by a first patterning for the second conductive film;, forming a capacitor dielectric film below the upper electrode by a second patterning for the second insulating film after the first patterning, wherein the capacitor dielectric film includes a portion extending laterally beyond the upper electrode;

forming an anti-reflection coating film to cover the first conductive film and the capacitor dielectric film;

forming a resist pattern for shapes of a capacitor lower electrode and a gate electrode of a transistor by coating the anti-reflection coating film with photoresist and subjecting the photoresist to exposure and development;

forming the capacitor lower electrode and the gate electrode of the transistor by using the resist pattern as a mask to perform a third patterning for the anti-reflection coating film and the first conductive film;

removing the anti-reflection coating film remaining on the capacitor upper electrode and the gate electrode of the transistor after the resist pattern is removed; and forming a source and a drain for the transistor by introducing impurities to both sides of the gate electrode of the semiconductor substrate.

2. A method for manufacturing a semiconductor device according to claim 1, further comprising the step of:

forming insulating spacers respectively on sides of the upper and lower electrodes and the gate electrode, said step being included between the step of forming the capacitor lower electrode and the gate electrode of the transistor and the step of removing the anti-reflection coating film.

3. A method for manufacturing a semiconductor device according to claim 1, wherein said first and second conductive films are made of amorphous silicon or polycrystalline silicon.

4. A method for manufacturing a semiconductor device according to claim 1, wherein one selected from a KrF light source and an ArF light source is used for exposure of the photoresist.

5. A method of manufacturing a semiconductor device according to claim 1, wherein for said anti-reflection coating film, one selected from a group consisting of a silicon film having a refractive index of 2.3 or higher, a silicon nitride film and a silicon oxynitride film is used.

6. A method for manufacturing a semiconductor device, comprising the steps of:

forming an insulating film on a semiconductor substrate;

forming a silicon film on the insulating film, said silicon film being made of amorphous silicon, or polycrystalline silicon;

selectively introducing impurities to a region of the silicon film for forming a capacitor dielectric film forming an oxide film on the impurity introduced portion by performing thermal oxidation for a surface of the silicon film, said oxide film being thicker than other portions;

forming a conductive film above the semiconductor substrate;

forming a capacitor upper electrode by performing patterning for the conductive film, and leaving the impurity introduced portion of the oxide film formed by said thermal oxidation as a capacitor dielectric film while removing other portions of the same;

forming an anti-reflection coating film above the semiconductor substrate;

forming a resist pattern for shapes of a capacitor lower electrode and a gate electrode of a transistor by coating the anti-reflection coating film with photoresist and then subjecting the photoresist to exposure and development;

forming a capacitor lower electrode and a gate electrode of the transistor by using the resist pattern as a mask to perform patterning for the silicon film and the anti-reflection coating film;

removing the anti-reflection coating film remaining on the upper electrode and the gate electrode; and forming a source and a drain for the transistor by introducing impurities to both sides of the gate electrode of the semiconductor substrate.

7. A method for manufacturing a semiconductor device according to claim 6, further comprising the step of:

forming insulating spacers respectively on sides of the upper and lower electrodes and the gate electrode, said step being included between the step of forming the capacitor lower electrode and the gate electrode of the transistor and the step of removing the anti-reflection coating film.

8. A method for manufacturing a semiconductor device according to claim 6, wherein one selected from a KrF light source and an ArF light source is used for exposure of the photoresist.

9. A method for manufacturing a semiconductor device according to claim 6, wherein for said anti-reflection coating film, one selected from a group consisting of a silicon film having a refractive index of 2.3 or higher, a silicon nitride film and a silicon oxynitride film is used.

* * * * *